(12) United States Patent
Arena et al.

(10) Patent No.: US 6,169,658 B1
(45) Date of Patent: Jan. 2, 2001

(54) PLENUMLESS AIR COOLED AVIONICS RACK

(75) Inventors: John J. Arena, Ramona; David M. Smith, Placentia; Richard A. Matonis, Poway, all of CA (US)

(73) Assignee: TRW Inc., Redondo Beach, CA (US)

( * ) Notice: Under 35 U.S.C. 154(b), the term of this patent shall be extended for 0 days.

(21) Appl. No.: 09/417,447

(22) Filed: Oct. 13, 1999

(51) Int. Cl.$^7$ ...................................................... H05K 7/20
(52) U.S. Cl. .......................... 361/704; 361/702; 361/707; 361/757; 361/788; 361/796; 361/800; 165/80.3; 165/80.4; 165/185; 165/104.33; 211/41.17
(58) Field of Search .................................... 361/683–687, 361/696–702, 704–710, 717–723, 727, 756, 757, 788, 796, 798, 800, 816; 165/80.2, 80.3, 80.4, 165, 104.32, 104.33, 104.34, 185, 104.26; 174/15.2, 16.3; 62/434, 376; 211/41.17

(56) References Cited

U.S. PATENT DOCUMENTS

| | | | |
|---|---|---|---|
| 4,493,010 | * | 1/1985 | Morrison et al. ...................... 361/385 |
| 5,057,968 | * | 10/1991 | Morrison .............................. 361/385 |
| 5,262,587 | * | 11/1993 | Moser ................................. 174/15.1 |
| 5,506,751 | * | 4/1996 | Chatel ................................. 361/690 |
| 5,991,163 | * | 11/1999 | Marconi et al. ...................... 361/788 |

* cited by examiner

Primary Examiner—Leo P. Picard
Assistant Examiner—Michael Datskovsky
(74) Attorney, Agent, or Firm—Michael S. Yatsko

(57) ABSTRACT

A rack (70) for a plurality of electronics modules (36) that does not include inlet and outlet air cooling plenums. The rack (70) includes a heat exchanger (72) including three separate sections (78, 80, 82), where each section (78, 80, 82) include spaced-apart parallel fins (84, 86, 88). First and second end sections (80, 82) of the heat exchanger (72) include cooling fins (86, 88) that extend parallel to each other in a front-to-back direction relative to the direction the modules (36) are slid into the rack (70). The first and second end sections (80, 82) are positioned at opposite ends of a center section (78), where the fins (84) of the center section (78) extend in a direction transverse to the direction the modules (36) are slid into the rack (70). The channels between the fins (86, 88) in the first and second end sections (80, 82) are aligned with inlet and outlet ports (94, 98) extending through a back panel (52) of the rack (70). The first and second end sections (80, 82) are angled relative to ends (104, 108) of the center section (78) so that the fins (84, 86, 88) between the sections (78, 80, 82) are aligned. Cooling air that enters the first section (80) from the air inlet port (94) flows through the first end section (80), then down the center section (78) into the second end section (82), and then out the air outlet port (98).

14 Claims, 3 Drawing Sheets

PLENUMLESS AIR COOLED AVIONICS RACK

BACKGROUND OF THE INVENTION

1. Field of the Invention

This invention relates generally to a rack for mounting and connecting a plurality of electronics modules and, more particularly, to a rack for mounting and connecting a plurality of electronics modules, where the rack does not include inlet and outlet cooling plenums.

2. Discussion of the Related Art

Many electronic systems employ independent electronics modules that are slidably positioned within an electronics rack, and electrically connected to each other therein. One particular known electronics rack is used for mounting and connecting avionics electronics modules. As is well understood in the art, the operation of electronics systems generates heat. The closer the electronics modules are mounted together, the more heat is generated per unit area, and the harder it is for the heat to dissipate. If too much heat is generated, the electronics modules may not operate correctly, and their useful life will be reduced. Additionally, generation of a significant amount of heat creates a fire hazard. Therefore, one of the primary functions of the rack is to provide cooling of the modules.

In one rack design, cooling air is forced through a heat exchanger configured within the rack to provide cooling of the electronic modules. FIG. 1 is a perspective view of an electronics rack 10 of this type that is known in the art. The rack 10 includes an outer housing 12 having a front opening 14. A lower card guide 16 is mounted at a lower location within the housing 12 by flanges 18 secured to opposing side panels 20 and 22 of the housing 12. The card guide 16 is a single piece unit made of a heat conductive metal, such as aluminum. The card guide 16 includes a plurality of parallel tabs 28 extending from front to back that define grooves 30 therebetween. Each tab 28 includes an alignment nub 32 positioned proximate the opening 14. An upper card guide (not shown) is also mounted within the housing 12 at an upper location in the same manner, and also includes parallel tabs defining grooves therebetween.

The parallel grooves 30 in the lower card guide 16 and the parallel grooves in the upper card guide are aligned and suitably spaced apart to receive electronics modules 36 in a certain configuration. Each electronics module 36 includes a lower tab 38 that is inserted in one of the grooves 30 in the lower guide 16 and an upper tab 40 that is inserted in a corresponding groove in the upper guide. When the module 36 is slid into the housing 12, an electrical connector 42 is electrically connected with a mating electrical connector (not shown) at the back of the housing 12 to provide the desired electrical connection. Multiple electronics modules 36 are slid into the housing 12 in a parallel format to provide the overall electrical system. It is generally desirable to set the spacing of the grooves 30 and the thicknesses of the electronics modules 36 to allow as many modules 36 as possible to be stored in the rack 10 to conserve space.

The modules 36 generate heat during operation. The rack 10 therefore provides assisted cooling of the modules 36 to draw away the heat. FIG. 2 is a cross-sectional view of the rack 10 through line 2—2 in FIG. 1. The tabs 38 and 40 make contact with the lower card guide 16 and the upper card guide in a heat transfer engagement. To provide the cooling, forced air is caused to circulate across the lower card guide 16 and the upper card guide to draw heat away from the modules 36. An inlet plenum 46 is attached to the side surface 20 at one side of the housing 12 and an outlet plenum 48 is attached to the side surface 22 at an opposite side of the housing 12. Of course, the inlet and outlet plenums 46 and 48 can be reversed. The inlet plenum 46 includes a rectangular opening 50 through a backwall 52 of the housing 12 that allows cooling air to enter the plenum 46. The outlet plenum 48 includes a rectangular opening 54 through the wall 52 that allows the heated air to exit the outlet plenum 48 and the housing 12.

A heat exchanger 60 is positioned within a specially configured cavity in a base plate 62 between a bottom wall of the housing 12 and the card guide 16. A similar heat exchanger is also provided between the top wall and the upper card guide. The heat exchanger 60 includes a plurality of spaced apart fins 64 that extend transverse to the opening 14. The cooling air from the inlet plenum 46 is forced into the heat exchanger 60 and flows between the fins 64 across the card guide 16 to collect heat therein. The fins 64 increase the surface area exposed to the cooling air to increase the heat removal capacity. As the operation of the modules 36 heats the upper and lower card guides, air flowing between the fins 64 acts to draw heat away from the modules 36, providing the cooling. The inlet plenum 46 provides cooling air to both the upper and lower heat exchangers.

The spacing between the cooling fins 64, and the height and width of the cooling fins 64, is determined by the desired amount of air flow to provide the desired amount of cooling, as is understood in the art. In alternate variations, the rack 10 can include a plurality of stack layers where electronics modules 36 are positioned between card guides in each separate layer, and cooling is provided at each layer in the manner as discussed herein.

The above-described process of providing cooling of electronics module in an electronics rack has been effective in removing heat from the electronics module. However, the overall electronics packaging density of the system is reduced because finite amounts of volume must be dedicated to the inlet and outlet plenums 46 and 48. Because the size and weight of the electronic system may be an important parameter in different types of systems, it may be desirable to provide an electronics rack that eliminates the plenums 46 and 48, but distributes cooling air to the modules 36 at a higher or at least as high volumetric efficiency. It is therefore an object of the present invention to provide such a plenumless electronics rack.

SUMMARY OF THE INVENTION

In accordance with the teachings of the present invention, a rack for a plurality of electronics modules is disclosed where the rack does not include air cooling plenums to conserve space. However, it is still desirable to apply and remove cooling air through a back wall of the rack. Therefore, because the air cooling plenums have been eliminated, a different technique must be provided to allow air to flow through the heat exchanger transverse to the front opening in the rack.

To provide this technique, the present invention proposes a heat exchanger including three separate sections. Each section includes a plurality of spaced-apart parallel fins. First and second end sections of the heat exchanger include cooling fins that extend parallel to each other in a front-to-back direction relative to the direction the modules are slid into the rack. The first and second end sections are positioned at opposite ends of a center section, where the fins of the center section extend in a direction transverse to the direction the modules are slid into the rack and perpendicular to the fins in the first and second sections. The channels between the fins in the first and second end sections are aligned with inlet and outlet ports in a back panel of the rack. The first and second end sections are angled relative to ends of the center section so that the fins between the sections are aligned. Cooling air that enters the first section from the air inlet port flows through the first end section, then down the center section and into the second end section, and then out the air outlet port.

Additional objects, features and advantages of the invention will become apparent from a consideration of the following description and the appended claims when taken in connection with the accompanying drawings.

DETAILED DESCRIPTION OF THE PREFERRED EMBODIMENTS

The following discussion of the preferred embodiments directed to a plenumless rack for a plurality of electronics modules is merely exemplary in nature, and is in no way intended to limit the invention or its applications or uses.

Figure 1:
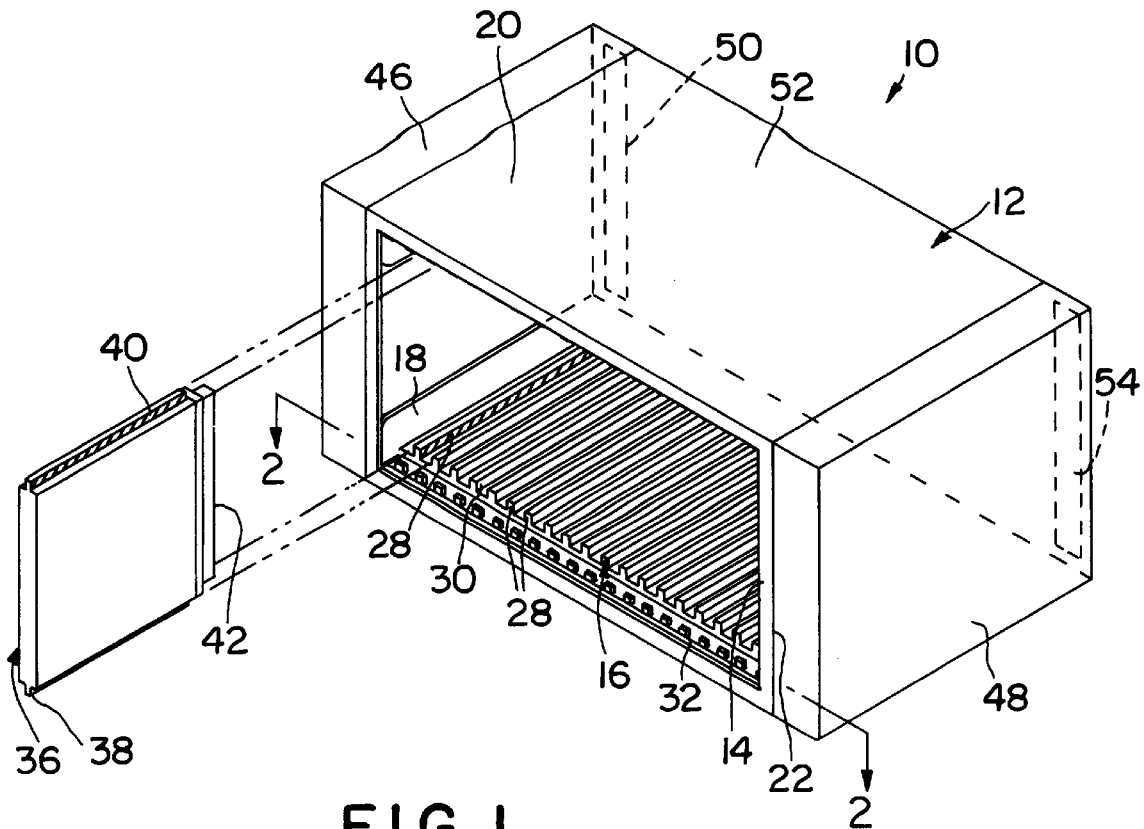
FIG. 1 is a perspective view of a rack, known in the art, for mounting a plurality of electronics modules.
Figure 2:
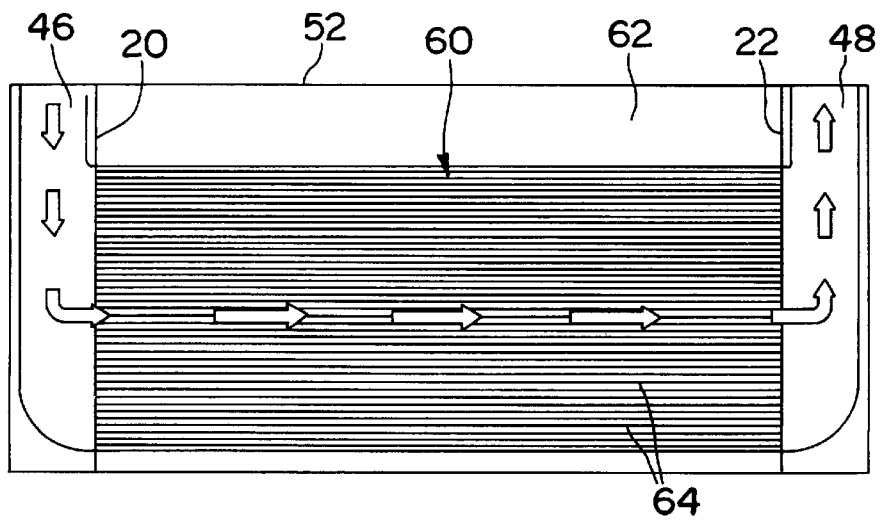
FIG. 2 is a cross-sectional view through line 2—2 of the rack shown in FIG. 1.
Figure 3:
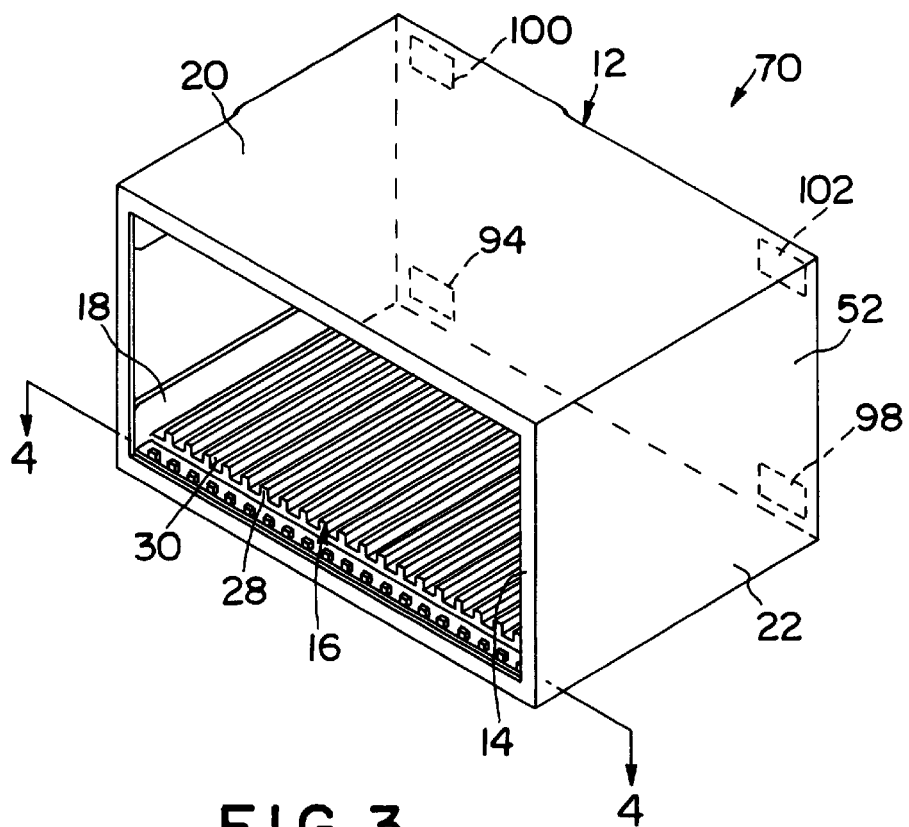
FIG. 3 is a perspective view of a rack for mounting a plurality of electronics modules, where the rack does not include inlet and outlet cooling plenums, according to an embodiment of the present invention.
Figure 4:
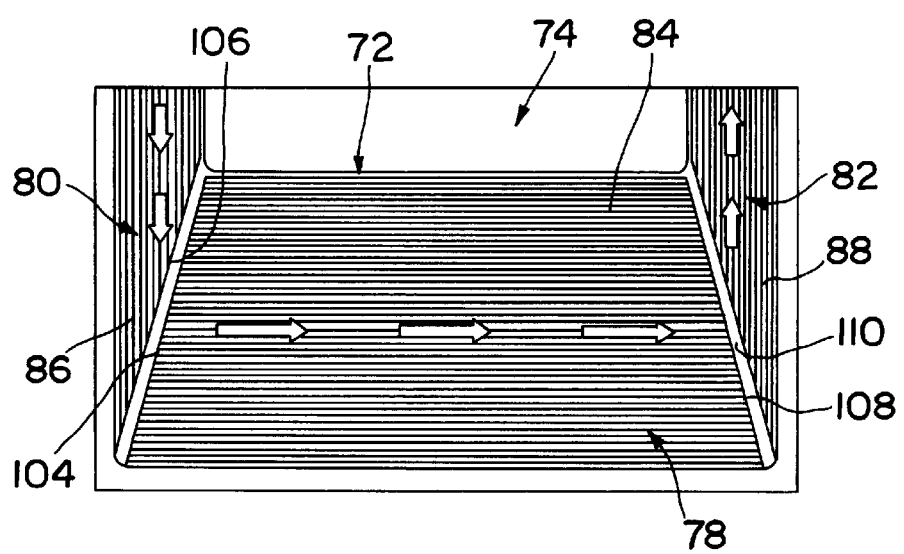
FIG. 4 is a cross-sectional view of the rack shown in FIG. 3 through line 4—4.

FIG. 3 is a perspective view of an electronics rack 70, according to an embodiment of the present invention. FIG. 4 is a cross-sectional view of the rack 70 through line 4—4 in FIG. 3. The rack 70 can be used to hold and connect the same electronics modules 36 as the rack 10, and therefore like components are identified by the same reference numeral and are described above. For clarity purposes, the module 36 is not shown in these figures. The plenums 46 and 48 have been removed, and thus the overall width of the rack 70 is reduced from the width of the rack 10 by the size of the plenums 46 and 48. This allows the rack 70 to use less space than the rack 10, or provide more space that is available for more electronics modules 36 in the same area. In this design, it is still desirable to accommodate the flow of the cooling fluid through the back panel 52 of the rack 70. The present invention proposes a heat exchanging system that allows the plenums 46 and 48 to be eliminated, yet also allows a cooling fluid to flow from side-to-side in the rack 70 transverse to the direction that the modules 36 are slid into the rack 70.

Figure 5:
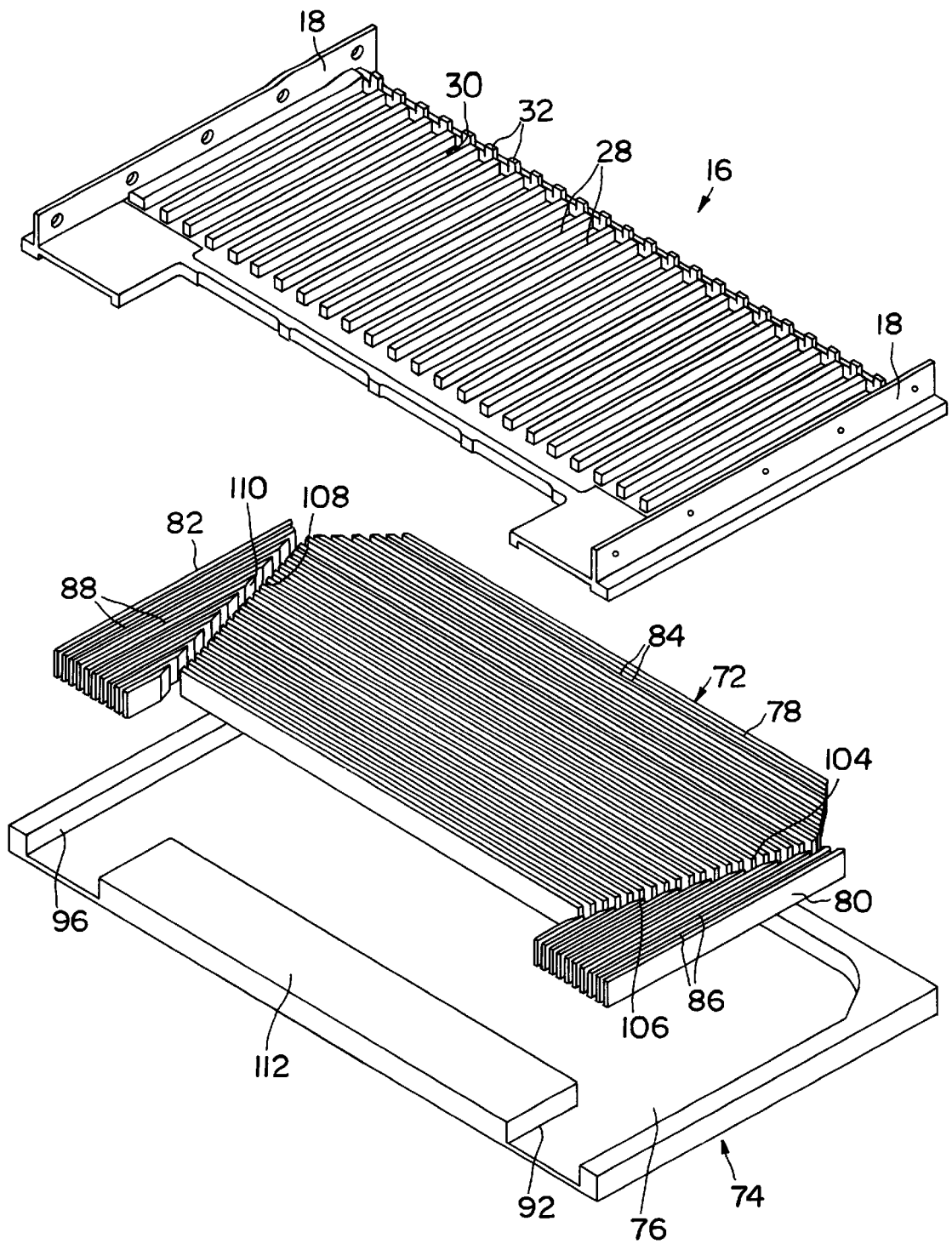
FIG. 5 is an exploded perspective view of a heat exchanger assembly used in the rack shown in FIG. 3.

To provide cooling of the electronics modules 36 within the rack 70, the present invention proposes replacing the heat exchanger 60 with a heat exchanger 72. FIG. 5 shows an exploded perspective view of the heat exchanger 72 in combination with a modified base plate 74, according to the invention and the lower card guide 16. The base plate 74 includes a specialized cavity 76 that accommodates and positions the heat exchanger 72 in its appropriate location.

The heat exchanger 72 includes three separate pieces independently positioned within the cavity 76. Particularly, the heat exchanger 72 includes a center section 78, an inlet end section 80 and an outlet end section 82. The center section 78 includes a plurality of spaced apart and parallel fins 84 that extend transverse across the rack 70 in the same manner as the fins 64 of the heat exchanger 60. The inlet section 80 includes a plurality of spaced apart and parallel fins 86 that extend lengthwise in a direction from front-to-back relative to the rack 70, and substantially perpendicular to the length of the fins 84. Likewise, the outlet end section 82 includes a plurality of spaced apart and parallel fins 88 that extend lengthwise in a direction from front-to-back relative to the rack 70, and are also substantially perpendicular to the length of the fins 84. The width and height of the fins 84, 86 and 88, as well as the spacing of the channel between the fins 84, 86 and 88, would depend on a particular cooling capacity required and would be designed specifically for a particular electronics system. In this embodiment, the dimensions of the fins 84, 86 and 88 are the same, but in alternate designs, variations in the parameters between the fins may be desired.

The end section 80 extends into an inlet portion 92 of the cavity 76. The inlet portion 92 is in alignment with a cooling fluid inlet port 94 in the back wall 52 of the rack 70. Likewise, the end section 82 extends into an outlet portion 96 of the cavity 76. The outlet portion 96 is in alignment with an outlet port 98 in the back wall 52 of the rack 70. The base plate 74 includes a raised section 112 separating the inlet portion 92 from the outlet portion 96. An inlet port 100 and an outlet port 102 are also provided through the back panel 52 to accommodate a heat exchanger having this design that is positioned relative to the upper card guide.

In order to accommodate the flow of the cooling fluid through the heat exchanger 72, the cooling fluid must make a substantially 90° turn from the input section 80 to the center section 78, and a 90° turn from the center section 78 to the output section 82. To provide this flow, the center section 78 includes an angled end 104 that abuts against an angled side 106 of the inlet section 80 so that the fins 84 of the center section 78 and the fins 86 of the inlet section 80, as well as the channels between the fins 84 and 86, are in alignment. In this configuration, the fins 86 get progressively shorter from the side wall 20 towards the center section 78, and the fins 84 get progressively shorter from the opening 14 towards the backwall 52. This configuration provides alignment for all or most of the fins 84 with the fins 86 in a front-to-back manner. Likewise, an end 108 of the center section 78 is angled and abuts with an angled side 110 of the outlet section 82 so that the fins 84 align with the fins 88, and thus the channels between the fins 84 and 88 are in alignment. In this configuration, the length of the fins 88 get progressively shorter from the side wall 22 towards the center section 78.

In this arrangement, the cooling fluid entering the inlet port 92 flows through the fins 86, and into the center section 78. The cooling fluid continues to flow through the fins 84 of the center section 78, and then into the outlet end section 82. The cooling fluid flows through the fins 88 of the outlet end section 82 and out of the outlet port 94.

The foregoing discussion discloses and describes merely exemplary embodiments of the present invention. One skilled in the art will readily recognize from such discussion, and from the accompanying drawings and claims, that various changes, modifications and variations can be made therein without departing form the spirit and scope of the invention as defined in the following claims.

What is claimed is:

1. An electronics rack for holding a plurality of electronics modules, said rack comprising:

a housing including at least a back panel, a bottom panel and a front opening opposite the back panel, said back panel including at least one cooling fluid inlet port and at least one cooling fluid outlet port;

a first module guide positioned adjacent to the bottom panel, said first module guide configured to accept the plurality of electronics modules in a parallel arrangement that are slid into the housing through the opening; and a heat exchanger positioned between the module guide and the bottom panel, said heat exchanger having three separate sections including an inlet section, an outlet section and a center section, each of the sections including a plurality of spaced apart fins, said inlet section being positioned at one end of the center section and said outlet section being positioned at an opposite end of the center section, wherein the fins of the inlet section and the fins of the outlet section are aligned with the fins of the center section so that a cooling fluid introduced into the inlet port flows through the fins of the inlet section, then through the fins of the central section and then through the fins of the outlet section to the outlet port.

2. The rack according to claim 1 wherein the fins of the inlet section and the outlet section are oriented and extend substantially perpendicular to the back panel and the opening, and the fins of the center section are oriented and extend in a transverse direction between the back panel and the opening and substantially perpendicular to the orientation of the fins of the inlet section and the outlet section.

3. The rack according to claim 2 wherein ends of the center section are angled and adjacent sides of the inlet and outlet sections are angled so that the inlet and outlet sections and the center section are aligned in such a manner that at least most of the fins of the inlet section and the center section and the outlet section and the center section are aligned.

4. The rack according to claim 3 wherein the fins of the inlet section and the outlet section get progressively shorter from an outside of the inlet section and the outlet section to an inside of the inlet section and the outlet section.

5. The rack according to claim 1 wherein the inlet, outlet and center sections are positioned in a cavity of a base plate.

6. The rack according to claim 5 wherein the inlet section extends into an inlet portion of the cavity to be positioned proximate the inlet port and the outlet section extends into an outlet portion of the cavity to be positioned proximate the outlet port.

7. The rack according to claim 1 wherein the at least one air inlet port and the at least one air outlet port include four air inlet ports and exhaust ports positioned proximate the corners of the back panel.

8. The rack according to claim 1 wherein the electronics modules are avionics modules.

9. An electronics rack for holding a plurality of electronics module, said rack comprising:

a support structure including a back and a front, said front accepting the plurality of electronics modules where the electronics modules slide into the structure towards the back, said structure including at least one cooling fluid inlet port and at least one cooling fluid outlet port at the back; and a heat exchanger including three sections, said sections including an inlet section in fluid communication with the at least one inlet port, an outlet section in fluid communication with the at least one outlet port and a center section in fluid communication with the inlet section and the outlet section, each of the inlet, outlet and center sections including a plurality of spaced apart fins that are aligned with each other so as to provide the fluid communication, said inlet section being positioned at one end of the center section and said outlet section being positioned at an opposite end of the center section, and wherein the orientation of the fins of the inlet section and the outlet section are substantially perpendicular to the orientation of the fins of the center section.

10. The rack according to claim 9 wherein opposing ends of the center section are angled and adjacent sides of the inlet and outlet sections to the center section are angled so that the inlet and outlet sections and the center section are aligned to provide a substantial 90° turn for the cooling fluid to exit the inlet section and enter the center section, and exit the center section and enter the outlet section.

11. The rack according to claim 10 wherein the fins of the inlet section and the fins of the outlet section get progressively shorter from an outside of the inlet and outlet sections away from the center section to an inside of the inlet and outlet sections adjacent the center section.

12. The rack according to claim 9 further comprising at least one module guide including a plurality of parallel channels that accept the electronics module in a sliding engagement, said fins of the inlet and outlet sections extending in substantially the same direction as the channels in the guide, and said fins of the center section extending substantially perpendicular to the channels in the guide.

13. The rack according to claim 12 wherein the inlet, outlet and center sections are positioned in a cavity of a base plate.

14. The rack according to claim 12 wherein the inlet section extends into an inlet portion of the cavity to be positioned adjacent the inlet port and the outlet section extends into an outlet portion of the cavity to be positioned adjacent the outlet port.

* * * * *